United States Patent
Sorimachi

(10) Patent No.: US 10,516,090 B2
(45) Date of Patent: Dec. 24, 2019

(54) BACKING MEMBER

(71) Applicant: SHINKO ELECTRIC INDUSTRIES CO., LTD., Nagano-shi, Nagano (JP)

(72) Inventor: Haruo Sorimachi, Nagano (JP)

(73) Assignee: SHINKO ELECTRIC INDUSTRIES CO., LTD., Nagano-Shi (JP)

( * ) Notice: Subject to any disclaimer, the term of this patent is extended or adjusted under 35 U.S.C. 154(b) by 267 days.

(21) Appl. No.: 15/593,162

(22) Filed: May 11, 2017

(65) Prior Publication Data

US 2017/0338398 A1 Nov. 23, 2017

(30) Foreign Application Priority Data

May 20, 2016 (JP) ................................. 2016-101641

(51) Int. Cl.
| | | |
|---|---|---|
| H01L 41/04 | (2006.01) | |
| H01L 41/047 | (2006.01) | |
| B06B 1/06 | (2006.01) | |
| H01L 41/08 | (2006.01) | |

(52) U.S. Cl.
CPC ........ *H01L 41/0475* (2013.01); *B06B 1/0607* (2013.01); *H01L 41/0825* (2013.01)

(58) Field of Classification Search
CPC ....... B06B 1/06; B06B 1/0603; B06B 1/0607; B06B 1/0622; B06B 1/0629; H01L 41/0475
USPC ......................................... 310/322, 334, 335
See application file for complete search history.

(56) References Cited

U.S. PATENT DOCUMENTS

| | | | |
|---|---|---|---|
| 5,592,730 A | 1/1997 | Greenstein et al. | |
| 2010/0025785 A1* | 2/2010 | Robinson ............. | B06B 1/0622 257/416 |
| 2011/0316387 A1* | 12/2011 | Togasaki ............. | B06B 1/0622 310/334 |

FOREIGN PATENT DOCUMENTS

| | | |
|---|---|---|
| JP | H07-131895 A | 5/1995 |
| JP | H08-065797 A | 3/1996 |
| JP | 10-282074 | 10/1998 |
| JP | 2004-040250 | 2/2004 |
| JP | 2008-028462 A | 2/2008 |

OTHER PUBLICATIONS

Japanese Office Action dated Sep. 24, 2019, with English translation, 8 pages.

* cited by examiner

*Primary Examiner* — Derek J Rosenau
(74) *Attorney, Agent, or Firm* — Rankin, Hill & Clark LLP

(57) ABSTRACT

A backing member includes: a resin layer which contains a filler; and a plurality of leads each of which is embedded in the resin layer to penetrate through the resin layer from an upper surface of the resin layer to a lower surface of the resin layer. Each of the leads includes a wiring portion, and a terminal portion connected to one end of the wiring portion. A width dimension and a depth dimension of the wiring portion are smaller than a width dimension and a depth dimension of the terminal portion, and an interval between adjacent ones of the wiring portions of the leads is wider than an average particle size of the filler.

4 Claims, 18 Drawing Sheets

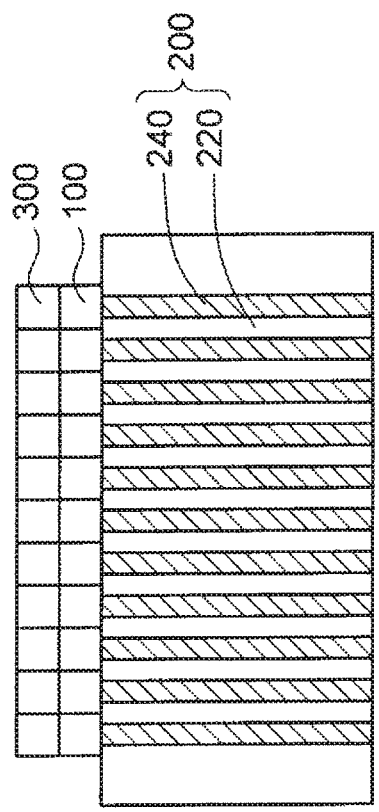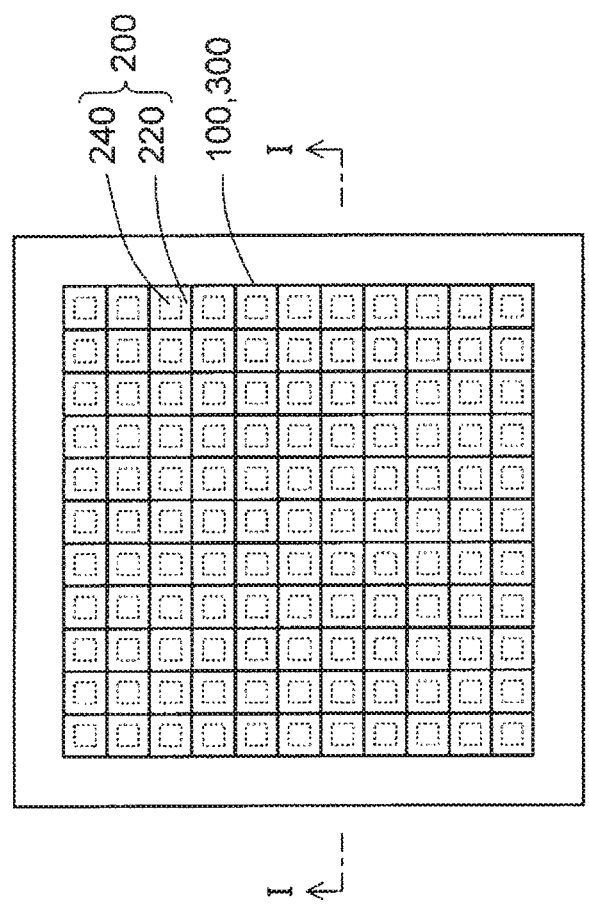
FIG. 1A
FIG. 1B

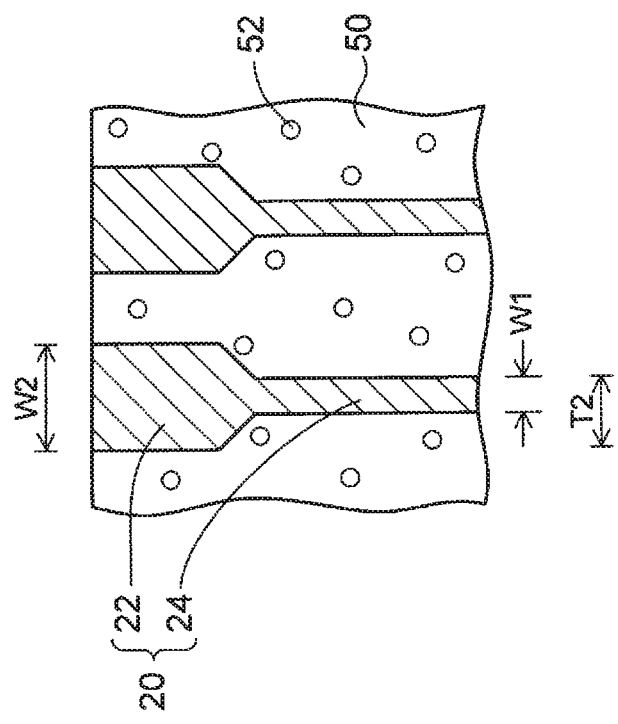
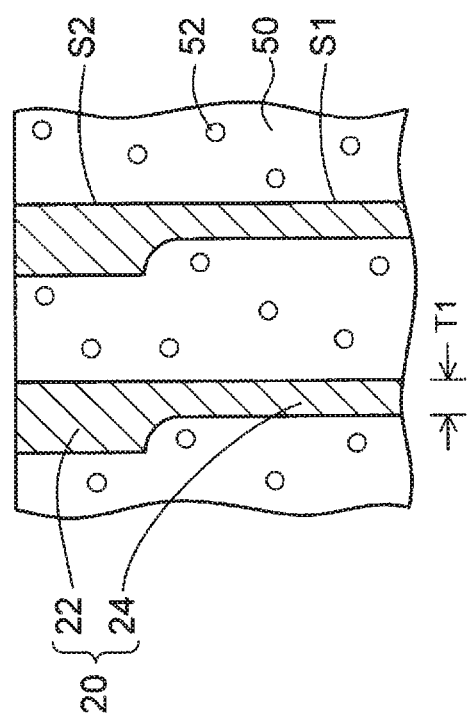

BACKING MEMBER

This application claims priority from Japanese Patent Application No. 2016-101641, filed on May 20, 2016, the entire contents of which are herein incorporated by reference.

BACKGROUND

1. Technical Field

The present disclosure relates to a backing member.

2. Description of the Related Art

In the related art, there is an ultrasonic diagnosis apparatus configured to image the inside of a subject using ultrasonic waves to thereby perform diagnosis based on the generated images. The ultrasonic diagnosis apparatus is provided with an ultrasonic probe for transmitting and receiving the ultrasonic waves.

In the ultrasonic probe, the ultrasonic waves are transmitted by piezoelectric elements and a backing member for absorbing rearward propagation of the ultrasonic waves is arranged on a lower side of the piezoelectric elements (e.g., see JP-A-10-282074 and JP-A-2004-40250).

In order to manufacture the backing member of the ultrasonic probe, a method is provided to array lead frames etc. and inject a resin containing fillers into any space among the lead frames etc., as will be described in paragraphs about a preliminary matter which will be described later.

However, by such a method, it is difficult to array leads at a pitch of about 300 μm or less with high precision. In addition, when the pitch of the leads is made narrower, it is difficult to disperse the fillers reliably during formation of the resin containing the fillers.

SUMMARY

The present disclosure is to provide a backing member having a novel structure in which a resin containing a filler can be formed reliably in any space among leads even when a pitch of the leads is made narrower.

According to one or more aspects of the present disclosure, there is provided a backing member.

The backing member comprises:
a resin layer which contains a filler; and
a plurality of leads each of which is embedded in the resin layer to penetrate through the resin layer from an upper surface of the resin layer to a lower surface of the resin layer.

Each of the leads comprises a wiring portion, and a terminal portion connected to one end of the wiring portion.

A width dimension and a depth dimension of the wiring portion are smaller than a width dimension and a depth dimension of the terminal portion.

An interval between adjacent ones of the wiring portions of the leads is wider than an average particle size of the filler.

According to one or more aspects of the present disclosure, there is provided a an ultrasonic apparatus.

The ultrasonic apparatus comprises:
a backing member; and
a plurality of ultrasonic wave transducer elements arranged on the backing member.

The backing member comprises:
a resin layer which contains a filler; and
a plurality of leads each of which is embedded in the resin layer to penetrate through the resin layer from an upper surface of the resin layer to a lower surface of the resin layer.

Each of the leads comprises a wiring portion, and a terminal portion connected to one end of the wiring portion.

A width dimension and a depth dimension of the wiring portion are smaller than a width dimension and a depth dimension of the terminal portion.

An interval between adjacent ones of the wiring portions of the leads is wider than an average particle size of the filler.

Each of the ultrasonic wave transducer elements is electrically connected to a corresponding one of the terminal portions of the leads.

BRIEF DESCRIPTION OF THE DRAWINGS

FIGS. 1A and 1B are a sectional view and a plan view showing an ultrasonic probe according to a preliminary matter;

FIGS. 16A and 16B are partial sectional views showing a state of leads inside the backing member in FIG. 15;

DETAILED DESCRIPTION

Figure 2:
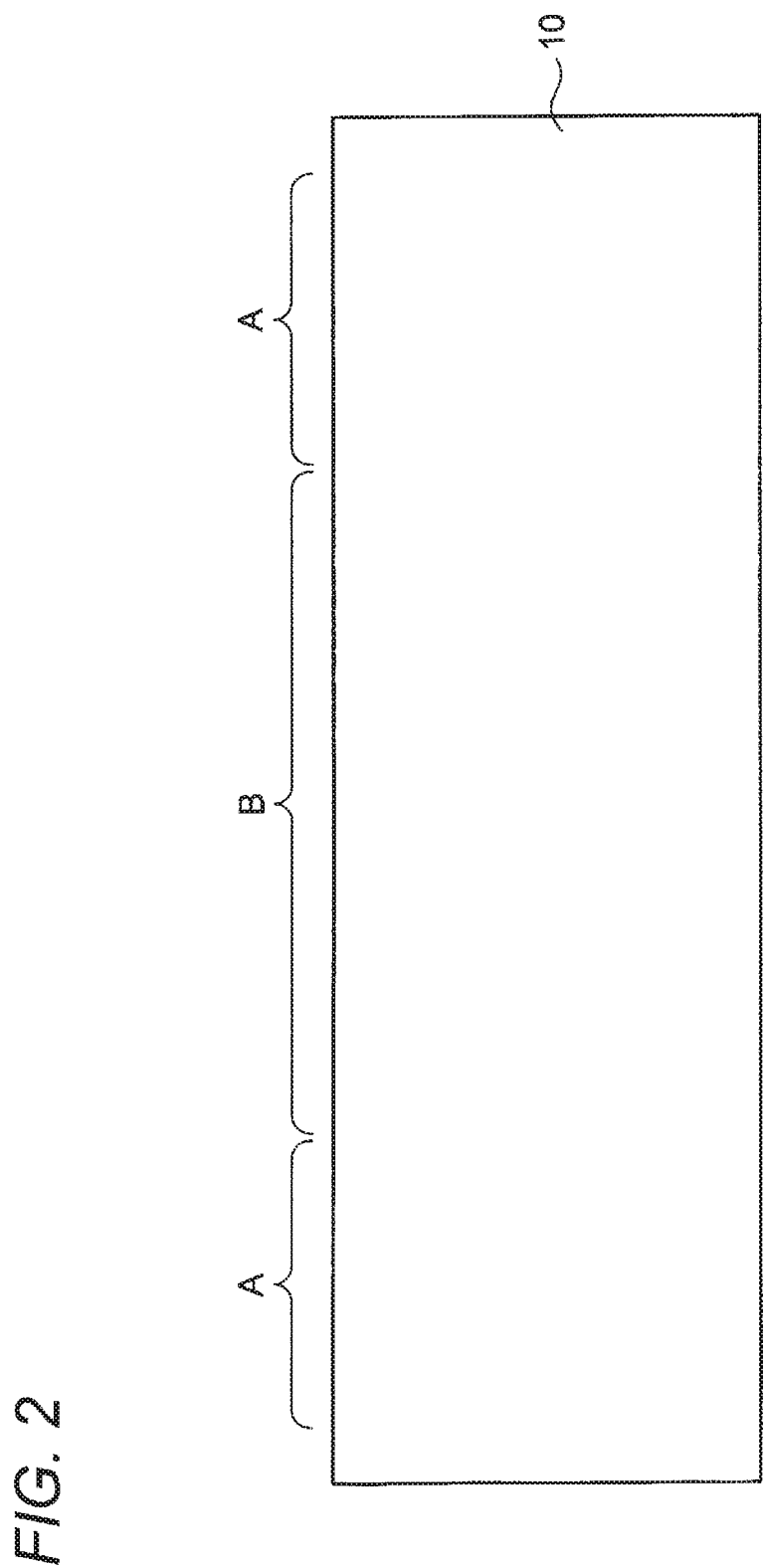
FIG. 2 is a plan view (Part 1) showing a method for manufacturing a backing member according to an embodiment.

An embodiment will be described below with reference to the accompanying drawings.

A preliminary matter underlying the embodiment will be described prior to description of the embodiment. Description of the preliminary matter is about the details of personal study of the present inventor, which contain contents of novel techniques rather than known techniques.

FIGS. 1A and 1B are a sectional view and a plan view showing an ultrasonic probe according to the preliminary matter. FIG. 1A corresponds to a section taken along a line I-I of the plan view of FIG. 1B.

As shown in FIGS. 1A and 1B, the ultrasonic probe according to the preliminary matter is provided with piezoelectric elements 100 generating ultrasonic waves. A backing member 200 for absorbing rearward propagation of the ultrasonic waves is arranged on a lower side of the piezoelectric elements 100.

In addition, an acoustic matching layer 300 for making the ultrasonic waves incident into a subject efficiently is arranged on an upper side of the piezoelectric elements 100.

The piezoelectric elements 100 are divided into a large number and arranged two-dimensionally. In addition, the backing member 200 includes a resin layer 220 which serves as a backing material, and leads 240 which are embedded in the resin layer 220.

Upper ends of the leads 240 are electrically connected to lower surfaces of the piezoelectric elements 100 respectively. A voltage is supplied to each of the piezoelectric elements 100 through a corresponding one of the leads 240.

In order to manufacture such a backing member 200 including the leads 240, a method is provided to array lead frames or flexible printed boards provided with wiring patterns, and inject a resin into any space among the lead frames or the flexible printed boards.

Alternatively, another method may be provided to dispose and bond lead frames or flexible printed boards on one another with interposition of a resin plate as a backing material therebetween.

Each of the leads 240 inside the backing member 200 does not have a function of absorbing an ultrasonic wave. It is therefore necessary to reduce a volume of the lead 240 as much as possible so that a volume of the resin layer 220 which is the backing material can be increased.

Assume that the lead frames are used. In this case, when the plate thickness of each of the lead frames is reduced, rigidity is spoiled so that the lead frames cannot be arrayed with high precision. Thus, it is difficult to reduce the sectional area of each of the leads.

On the other hand, assume that the flexible printed boards are used. In this case, it is difficult to electrically connect the wiring patterns to the piezoelectric elements because each of the wiring patterns is too thin. Therefore, after the backing member 200 is obtained, it is necessary to form electrodes on tips of the wiring patterns by plating etc. Each of the electrodes has a required area. This however leads to an increase in cost.

In addition, in accordance with a reduction in size of each of the piezoelectric elements 100 and an increase in density of arrangement of the piezoelectric elements 100, a pitch of the leads is required to be set at about 300 μm or less.

However, in the aforementioned method for manufacturing the backing member 200, it is difficult to arrange the leads at the pitch of about 300 μm or less with high precision.

In addition, the backing member 200 includes a resin containing a filler. The filler includes a plurality of particles. When the pitch of the leads is made narrower, an interval between adjacent ones of the leads becomes narrower than an average particle size of the fillers. Accordingly, it is difficult to disperse the fillers reliably.

The aforementioned problems can be solved in a backing member and an ultrasonic probe (an example of an ultrasonic apparatus) according to an embodiment which will be described below.

Embodiment

FIGS. 2 to 14 are views for explaining a method for manufacturing the backing member according to the embodiment. FIG. 15 is a view showing the backing member according to the embodiment. The structure of the backing member and the structure of the ultrasonic probe will be described below while the method for manufacturing the backing member is described.

In the method for manufacturing the backing member according to the embodiment, first, a metal plate 10 is prepared, as shown in FIG. 2. For example, the metal plate 10 is formed from a copper alloy plate used as a lead frame. The metal plate 10 is about 150 μm thick. In FIG. 2, the metal plate 10 corresponding to a region where two leads should be arranged is partially illustrated.

A plurality of leads can be formed in the metal plate 10. The metal plate 10 is divided into regions A in which terminal portions on opposite end sides of the leads should be arranged, and a region B in which wiring portions at central portions of the leads should be arranged.

Figure 3:
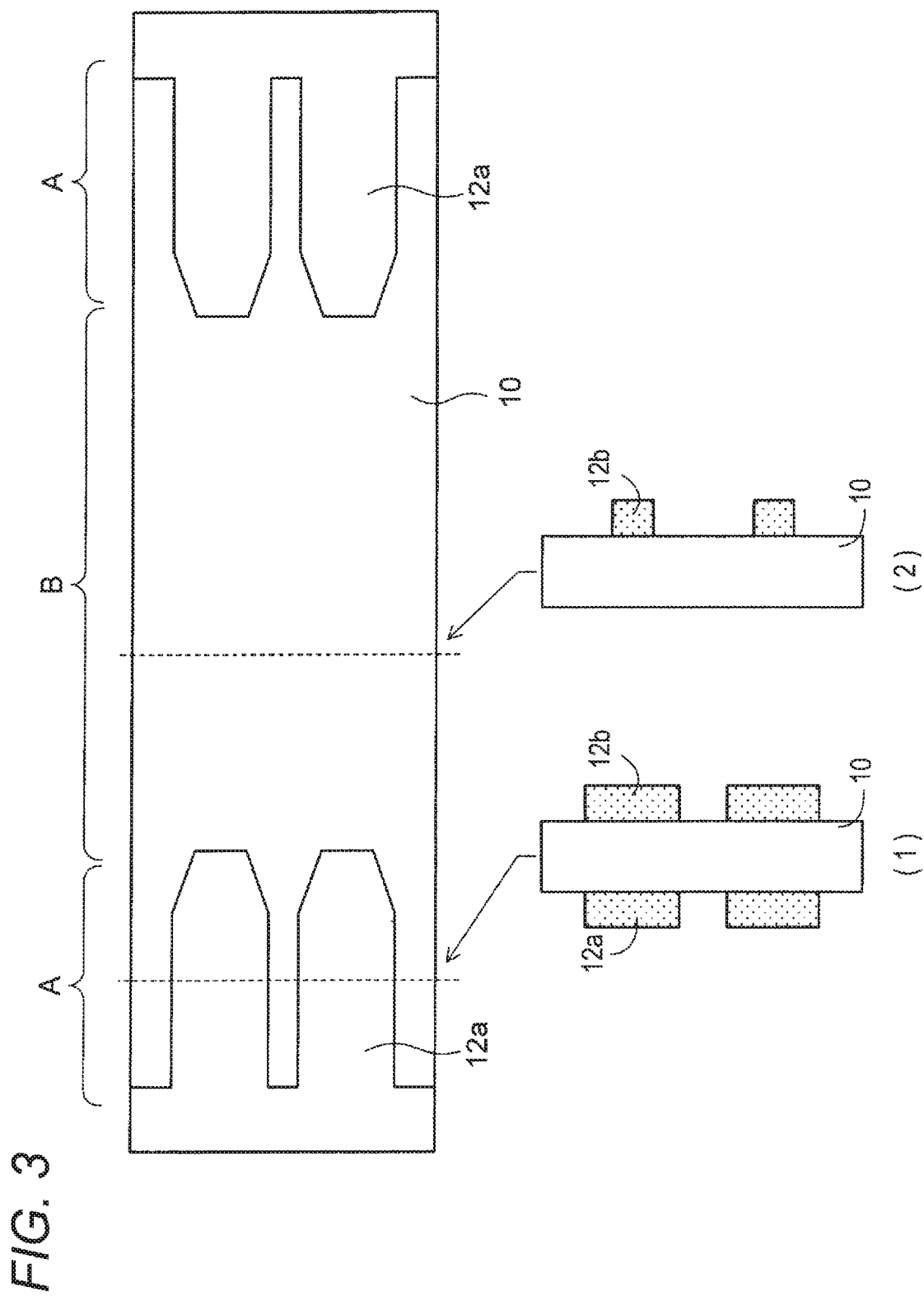
FIG. 3 is a plan view and sectional views (Part 2) showing the method for manufacturing the backing member according to the embodiment.

Next, as shown in FIG. 3, a first resist layer 12a is formed on an upper surface of the metal plate 10, and a second resist layer 12b is formed on a lower surface of the metal plate 10, in order to form the plurality of leads in the metal plate 10. The first resist layer 12a and the second resist layer 12b are exposed to light and developed based on photolithography technology so as to be formed into patterns.

As will be described later, each of the leads formed in the metal plate 10 is set so that a width and a thickness of the wiring portion arranged at the center portion of the lead are smaller than a width and a thickness of each of the terminal portions arranged on the opposite end sides of the lead. In addition, the lead is formed such that the terminal portions of the lead are connected to an outer frame obtained from the metal plate 10.

As shown in a plan view and a sectional view (1) of FIG. 3, the first resist layer 12a formed on the upper surface of the metal plate 10 is formed into patterns corresponding to the outer frame and only the terminal portions on the opposite end sides of the leads connected to the outer frame. In the region B where the wiring portions of the leads should be arranged, as shown in the plan view and a sectional view (2) of FIG. 3, the first resist layer 12a is not formed in the upper surface of the metal plate 10, but the upper surface of the metal plate 10 is opened thoroughly.

On the other hand, as shown in the sectional views (1) and (2) of FIG. 3, the second resist layer 12b formed on the lower surface of the metal plate 10 is formed into patterns corresponding to the outer frame and the entire leads connected to the outer frame.

Incidentally, the first resist layer 12a may be formed on the lower surface of the metal plate 10 and the second resist layer 12b may be formed on the upper surface of the metal plate 10, in a reverse manner to that in the example of FIG. 3. In short, the first resist layer 12a is formed on one surface of the metal plate 10 while the second resist layer 12b is formed on the other surface of the metal plate 10.

Figure 4:
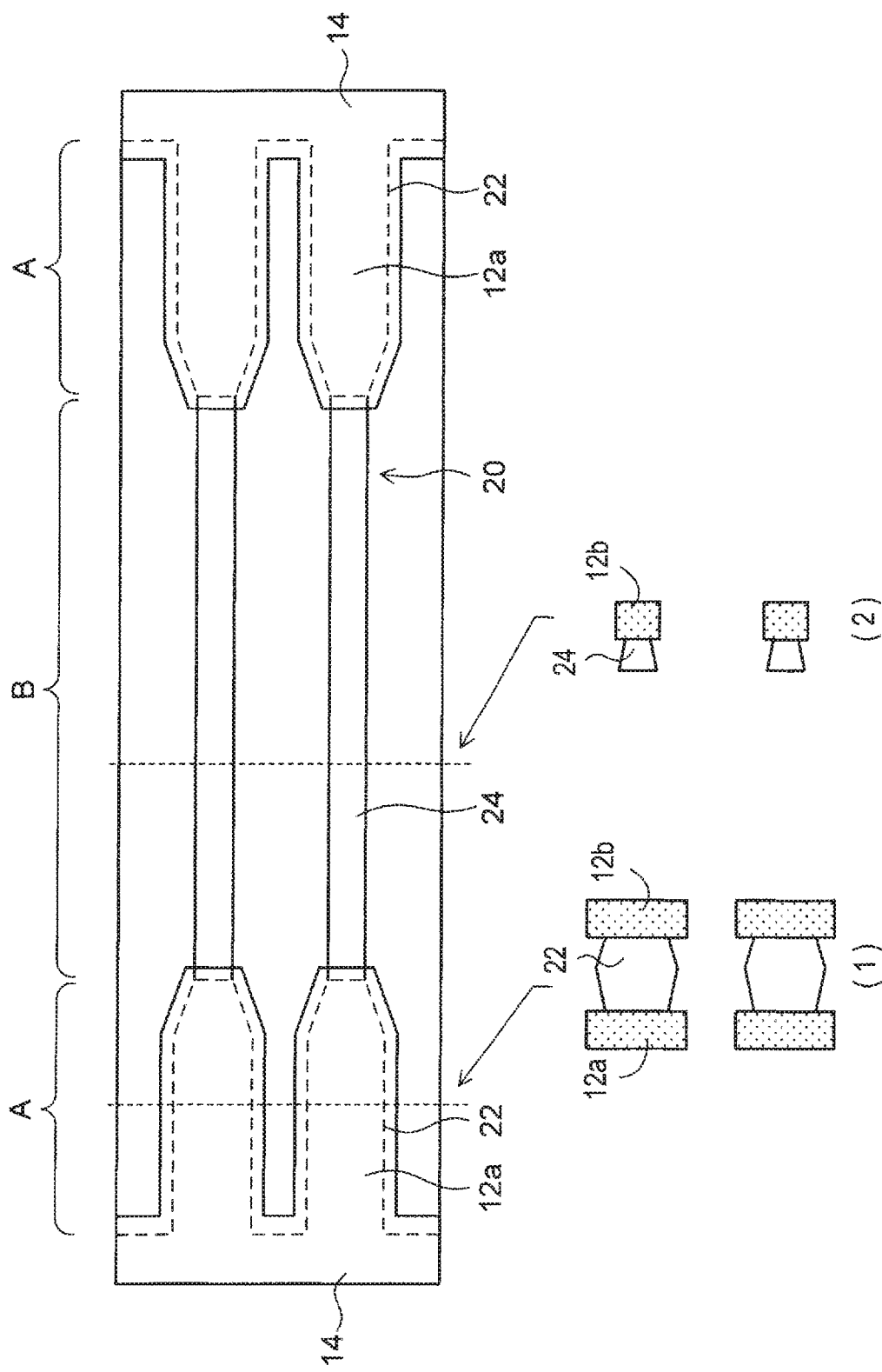
FIG. 4 is a plan view and sectional views (Part 3) showing the method for manufacturing the backing member according to the embodiment.

Successively, the metal plate 10 is wet-etched from the upper surface and the lower surface of the metal plate 10 using the first resist layer 12a and the second resist layer 12b as masks, as shown in FIG. 4. Spray etching is used as the wet etching. In addition, an aqueous solution of ferric chloride, an aqueous solution of cupric chloride, or an aqueous solution of ammonium persulfate etc. can be used as an etchant of the wet etching.

The etchant is sprayed on the upper surface and the lower surface of the metal plate 10, and half-etched simultaneously in a depth direction from the upper surface and the lower surface of the metal plate 10. Thus, the metal plate 10 is processed and bored.

On this occasion, in the regions A where the terminal portions on the opposite sides of the leads should be arranged, as shown in a sectional view (1) of FIG. 4, the first resist layer 12a on the upper surface side and the second resist layer 12b on the lower surface side are used as masks, with which the metal plate 10 is etched from the upper surface and the lower surface. Thus, the metal plate 10 is processed and bored.

The surface of the metal plate 10 etched from the upper surface thereof and the surface of the metal plate 10 etched from the lower surface thereof communicate with each other. Thus, the metal plate 10 is processed and bored. In this manner, terminal portions 22 of leads connected to an outer frame 14 are formed in the regions A of the metal plate 10.

The terminal portions 22 are formed such that the first resist layer 12a and the second resist layer 12b are arranged on upper surfaces and lower surfaces of the terminal portions 22. Therefore, each of the terminal portions 22 is as thick as the metal plate 10.

On the other hand, in the region B where the wiring portions of the leads should be arranged, as shown in a sectional view (2) of FIG. 4, the metal plate 10 is collectively etched in the depth direction from the upper surface up to the middle.

Simultaneously with this, the metal plate 10 is etched from the lower surface using the second resist layer 12b as a mask in the lower surface of the metal plate 10. Thus, wiring portions 24 of the leads are formed. The surface of the metal plate 10 etched from the upper surface thereof and the surface of the metal plate 10 etched from the lower surface thereof communicate with each other. Thus, the metal plate 10 is processed and bored.

On this occasion, the metal plate 10 is etched collectively from the upper surface in the region B of the metal plate 10. Accordingly, each of the wiring portions 24 is formed such that a film thickness of an upper part of the wiring portion 24 has been reduced. Thus, the wiring portion 24 is set to be thinner in thickness than each of the terminal portions 22. The wiring portion 24 is formed to be connected to the terminal portions 22 on the opposite sides of the wiring portion 24.

Thus, the leads 20 including the terminal portions 22 and the wiring portions 24 are formed. Spray pressure etc. in the spray etching can be adjusted to adjust etching rates on the upper surface side and the lower surface side of the metal plate 10.

Figure 5:
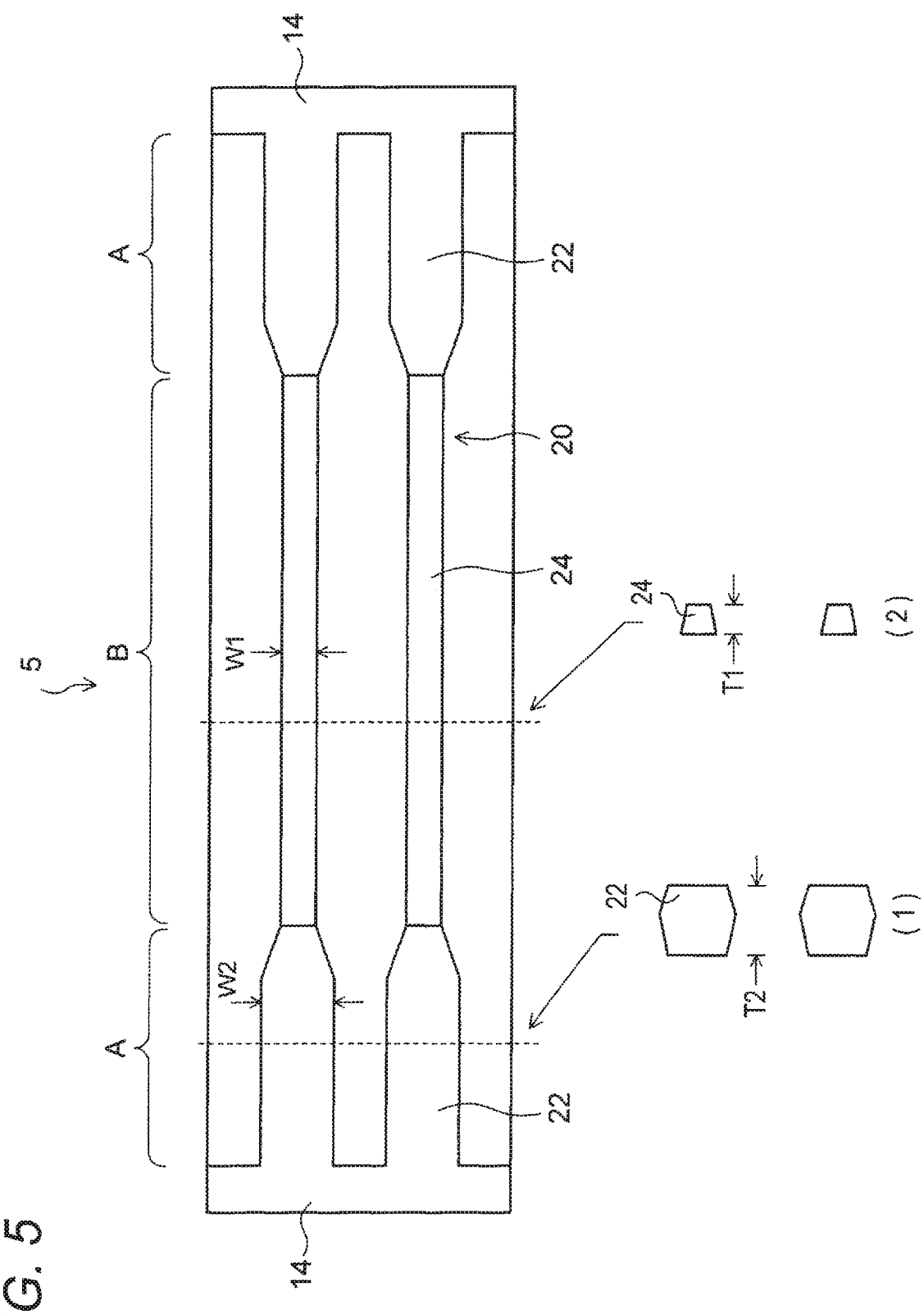
FIG. 5 is a plan view and sectional views (Part 4) showing the method for manufacturing the backing member according to the embodiment.

In the example in sectional views (1) and (2) of FIG. 5, the thickness of the wiring portion 24 of each of the leads 20 is reduced to be smaller than half of the thickness of the terminal portion 22. In order to achieve this, the etching rate on the upper surface side of the metal plate 10 is set to be higher.

Figure 6:
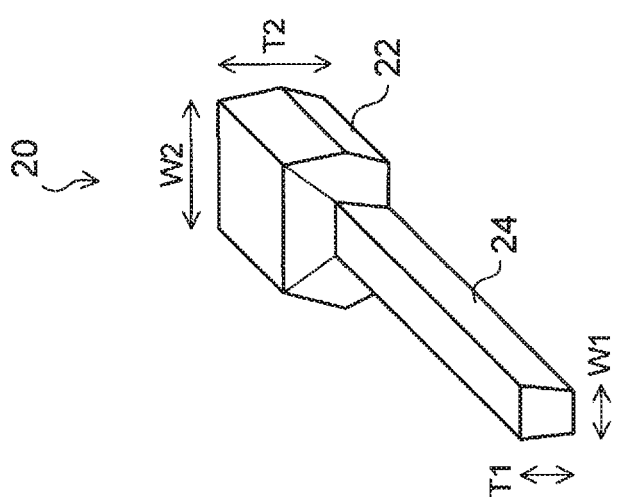
FIG. 6 is a perspective view showing a terminal portion and a wiring portion of a lead in FIG. 5.

FIG. 5 shows a state in which the first resist layer 12a and the second resist layer 12b have been removed from a structure body shown in FIG. 4. FIG. 6 is a perspective view partially showing the terminal portion 22 and the wiring portion 24 of the lead 20 in FIG. 5.

By the aforementioned method, a lead frame 5 in which the plurality of leads 20 are connected to the outer frame 14 can be obtained, as shown in FIG. 5. Each of the leads 20 is formed to include the wiring portion 24 which is arranged at a central portion of the lead 20 and the terminal portions 22 which are connected to the opposite ends of the wiring portion 24. The terminal portions 22 on the opposite sides of the lead 20 are formed to be connected to the outer frame 14.

As shown in FIG. 5 and FIG. 6, a width dimension W1 of the wiring portion 24 of the lead 20 is set to be smaller than a width dimension W2 of the terminal portion 22. In addition, a depth dimension T1 of the wiring portion 24 of the lead 20 is set to be smaller than a depth dimension T2 of the terminal portion 22.

In this manner, a sectional area of the wiring portion 24 of the lead 20 is set to be smaller than a sectional area of the terminal portion 22.

As shown in the sectional view (2) of FIG. 5, the wiring portion 24 of the lead 20 is formed into a rectangular shape similar to a trapezoid in section view. In addition, as shown in the sectional view (1) of FIG. 5, the terminal portion 22 of the lead 20 is formed into a hexagon in section, in which protrusions are arranged at the centers of opposite side surfaces.

As described above, a method is used to process and bore the metal plate 10 by wet etching once from the opposite surface sides of the metal plate 10 so as to form the leads 20.

Therefore, as shown in FIG. 6, the wiring portion 24 is connected to a depth-direction lower part of the terminal portion 22 in section so that a depth-direction lower surface of the wiring portion 24 and a depth-direction lower surface of the terminal portion 22 can be substantially flush with each other. In this manner, the wiring portion 24 is arranged in a position shifted to one end side (lower side) of the terminal portion 22 from the center of the terminal portion 22 in section.

For example, the width dimension W1 of the wiring portion 24 is set at 60 μm and the depth dimension T1 of the wiring portion 24 is set at 60 μm. In this case, the width dimension W2 of the terminal portion 22 is set at 150 μm to 200 μm and the depth dimension T2 of the terminal portion 22 is set at 150 μm to 200 μm.

By use of such a structure of each of the leads 20, the interval between adjacent ones of the wiring portions 24 of the leads 20 can be secured widely even when a pitch of the leads is narrowed, as will be described later. Accordingly, the resin containing the fillers can be formed reliably.

Figure 7:
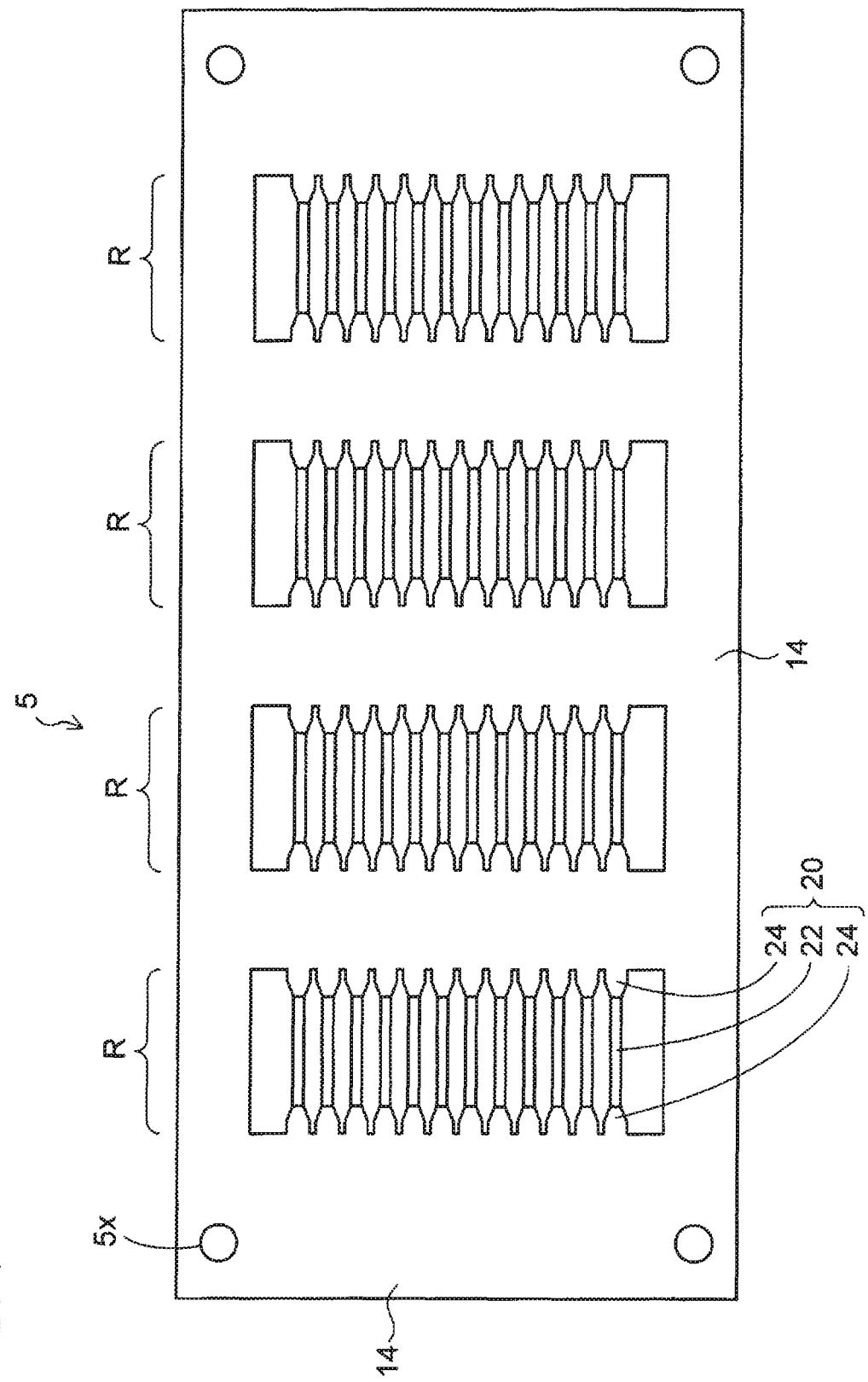
FIG. 7 is a plan view (Part 5) showing the method for manufacturing the backing member according to the embodiment.

A state of one entire lead frame 5 in which a large number of leads 20 have been formed by the aforementioned method is shown in FIG. 7. In the example of the lead frame 5 in FIG. 7, the leads 20 are arranged side by side in a longitudinal direction in four product regions R. In each of the product regions R, the terminal portions 22 on the opposite sides of the leads 20 are connected to and supported by the outer frame 14.

In addition, guide holes 5x through which guide pins can be inserted for positioning are formed at four corners of the lead frame 5.

Figure 8:
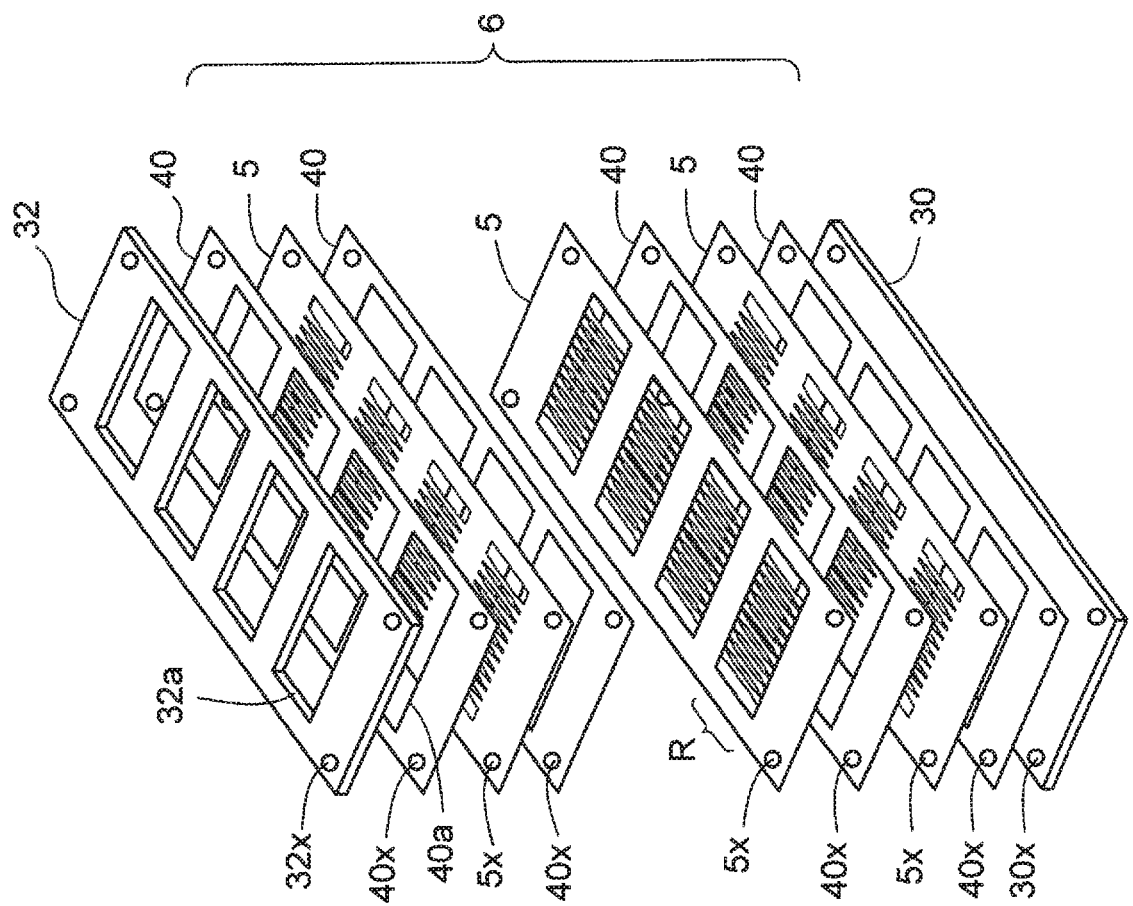
FIG. 8 is a perspective view (Part 6) showing the method for manufacturing the backing member according to the embodiment.

Next, a method for forming a backing member using the lead frame in FIG. 7 will be described. As shown in FIG. 8, first, a plurality of lead frames 5 in FIG. 7 are prepared. In FIG. 8, three lead frames 5 are illustrated.

Further, a lower-side support plate 30 and an upper-side support plate 32 are prepared. Opening portions 32a for injecting a resin are formed in the upper-side support plate 32. The opening portions 32a of the upper-side support plate 32 are arranged correspondingly to the aforementioned product regions R of the lead frames 5 in FIG. 7.

In addition, guide holes 32x corresponding to the aforementioned guide holes 5a of the lead frames 5 in FIG. 7 are formed at four corners of the upper-side support plate 32.

In order to stem the injected resin, the lower-side support plate 30 is shaped like a plate in which no opening portion is formed. In addition, a front surface of the lower-side support plate 30 is coated with a fluororesin so that the injected resin can be easily released. Alternatively, a fluororesin sheet or a polyethylene sheet etc. may be arranged on the lower-side support plate 30.

Guide hoes 30x corresponding to the aforementioned guide holes 5x of the lead frames 5 in FIG. 7 are formed at four corners of the lower-side support plate 30.

Further, a plurality of spacers 40 are prepared. Opening portions 40a for injecting a resin are formed in each of the spacers 40. The opening portions 40a of the spacer 40 are arranged correspondingly to the aforementioned product regions R of the lead frames 5 in FIG. 7, respectively.

The spacer 40 is arranged in order to define a pitch of the leads 20 of the stacked lead frames 5 in a stacking direction. The spacer 40 is formed of an elastic body. Preferably, an elastic resin such as resin sponge or elastic rubber is used as the spacer 40. When the spacer 40 is compressed and set at a desired thickness, the pitch of the leads 20 in the stacking direction can be adjusted.

Guide holes 40x corresponding to the aforementioned guide holes 5a of the lead frames 5 are formed at four corners of the spacer 40.

The lead frames 5 are stacked on one another through the spacers 40 between the lower-side support plate 30 and the upper-side support plate 32.

The example of FIG. 8 will be described in detail as follows. That is, a spacer 40 is arranged between the lower-side support plate 30 and a lower-side lead frame 5. In addition, a spacer 40 is arranged between the lower-side lead frame 5 and an intermediate lead frame 5.

In addition, a spacer 40 is arranged between the intermediate lead frame 5 and an upper-side lead frame 5. Further, a spacer 40 is arranged between the upper-side lead frame 5 and the upper-side support plate 32.

Guide pins (not shown) are inserted from the guide holes 32x of the upper-side support plate 32 up to the guide holes 30x of the lower-side support plate 30 through the respective guide holes 40x of the spacers 40 and the respective guide holes 5x of the lead frames 5.

Thus, the opening portions 32a of the upper-side support plate 32 and the respective opening portions 40a of the spacers 40 are aligned with the product regions R (FIG. 7) of the lead frames 5.

In this manner, a stacked body 6 in which the plurality of lead frames 5 have been stacked on one another through the spacers 40 is arranged between the lower-side support plate 30 and the upper-side support plate 32.

Practically, about twenty to one hundred lead frames 5 are stacked on one another through the spacers 40.

Figure 9:
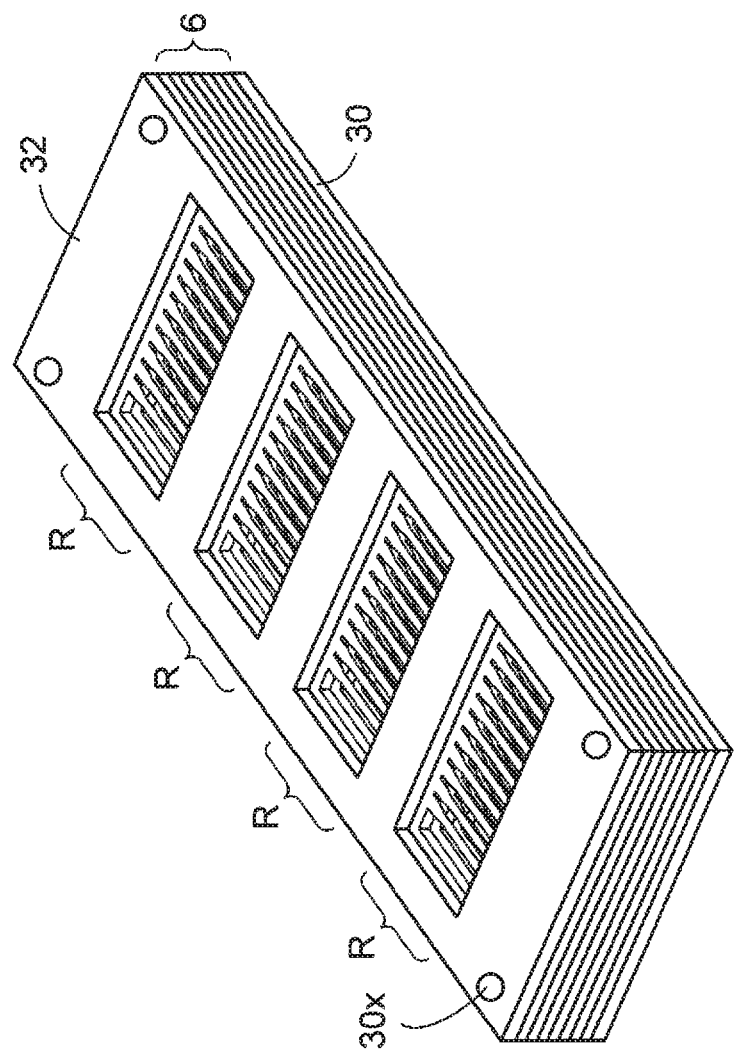
FIG. 9 is a perspective view (Part 7) showing the method for manufacturing the backing member according to the embodiment.

Further, as shown in FIG. 9, the stacked body 6 held between the lower-side support plate 30 and the upper-side support plate 32 is compressed and fixed such that each of the spacers 40 made of the elastic body has been set at the desired thickness.

For example, a structure body in FIG. 9 is arranged on a stage (not shown) and the upper-side support plate 32 is pressed downward by a pressure member (not shown). Alternatively, the structure body in FIG. 9 may be held between pressure members so as to be pressed by the pressure members from the upper and lower sides.

Thus, an interval between adjacent ones of the leads 20 of the stacked lead frames 5 in the stacking direction can be determined by the thickness of the corresponding compressed spacer 40.

A method using height adjusting stoppers can be provided as the method for setting the stacked body 6 held between the lower-side support plate 30 and the upper-side support plate 32 at a desired thickness.

Figure 10:
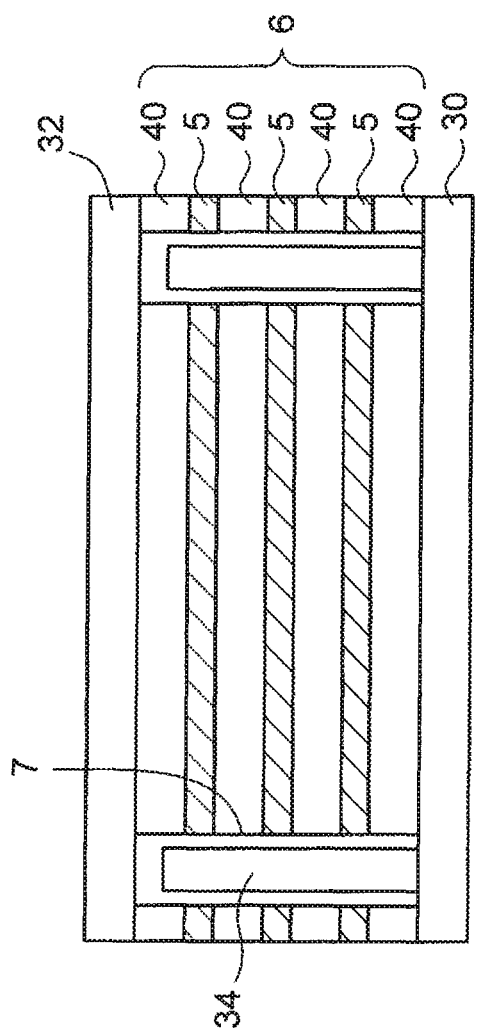
FIG. 10 is a sectional view (Part 8) showing the method for manufacturing the backing member according to the embodiment.

As shown in FIG. 10, through holes 7 are formed in advance in the stacked body 6 held between the lower-side support plate 30 and the upper-side support plate 32. In addition, when the aforementioned lead frames 5 in FIG. 7 are stacked on one another, height adjusting stoppers 34 are arranged inside the through holes 7.

Figure 11:
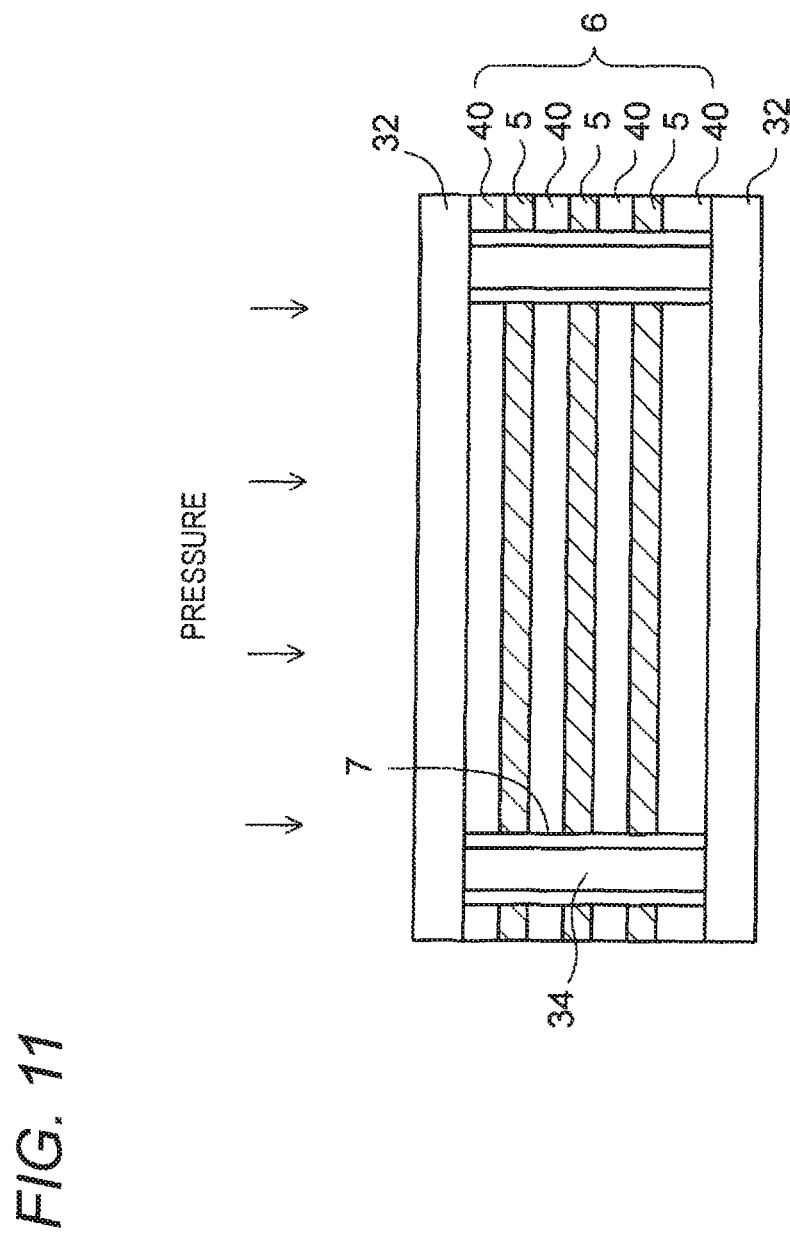
FIG. 11 is a sectional view (Part 9) showing the method for manufacturing the backing member according to the embodiment.

As shown in FIG. 11, the upper-side support plate 32 is pressed downward so that the upper-side support plate 32 can be brought into contact with upper ends of the height adjusting stoppers 34. When the height of each of the height adjusting stoppers 34 is adjusted, the thickness of the stacked body 6 held between the lower-side support plate 30 and the upper-side support plate 32 can be adjusted to the desired thickness.

In this manner, the thickness of each of the spacers 40 in the stacked body 6 can be adjusted. Accordingly, the pitch of the leads 20 of the stacked lead frames 5 in the stacking direction can be adjusted.

In this manner, both a pitch of the leads 20 in a width direction and a pitch of the leads 20 in the depth direction can be set at about 300 μm or less with high precision.

Thus, the lead frames 5 in each of which the plurality of leads 20 have been formed are stacked on one another through the spacers 40. Next, the thickness of the stacked body 6 is adjusted by the height adjusting stoppers 34 by pressing the upper-side support plate 32 downward. Then, the height adjusting stoppers 34 are fixed to the upper-side support plate 32 by screws or the like.

Accordingly, the leads 20 can be arranged with high precision at small pitches in the width direction and the depth direction. In addition, the plurality of product regions R can be formed in each of the lead frames 5. Therefore, a plurality of backing members can be manufactured simultaneously so that the cost can be reduced.

Figure 12:
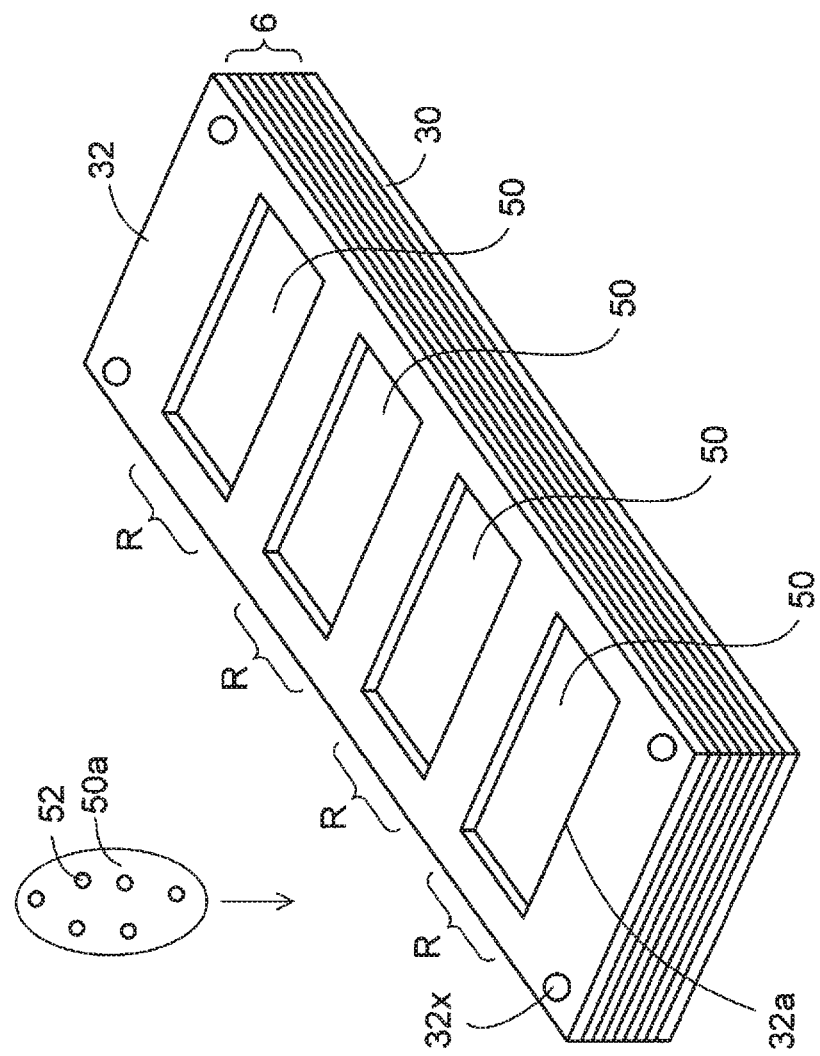
FIG. 12 is a sectional view (Part 10) showing the method for manufacturing the backing member according to the embodiment.

Next, as shown in FIG. 12, a resin 50a containing a filler 52 is injected from the opening portions 32a of the upper-side support plate 32 into hollow portions of the product regions R in which the leads 20 of the lead frames 5 have been stacked on one another. An epoxy resin can be preferably used as the resin 50a.

The resin 50a is injected in a vacuum, and foam generated when the resin 50a is injected is defoamed in a vacuum. Then, the resin 50a is hardened by heating treatment at a temperature of 150° C. for two hours to thereby obtain resin layers 50. In this manner, the large number of leads 20 which have been arranged side by side in the width direction and the depth direction in the plurality of product regions R are embedded in the resin layers 50.

Even when pressing force applied to the stacked body 6 held by the lower-side support plate 30 and the upper-side support plate 32 has been released on this occasion, the stacked leads 20 are fixed by each of the resin layers 50. The stacked body 6 is kept as thick as the stacked body 6 which was compressed.

Here, the filler 52 contained in the resin layer 50 will be mentioned. A material having an acoustic impedance largely different from an acoustic impedance of the resin layer 50 is used as the filler 52 so that the resin layer 50 containing the filler 52 can exert a function of scattering and attenuating each ultrasonic wave.

Therefore, a material large in acoustic impedance, such as tungsten or alumina, or a material small in acoustic impedance, such as hollow glass balls, can be used as the filler 52.

In addition, sound velocity of a mother material such as an epoxy resin is about 2,000 m/sec. In addition, a frequency of the ultrasonic wave ranges from 2 MHz to 20 MHz. A low frequency poor in absorption is used for the purpose of diagnosing an inner part of a human body.

When the frequency of the ultrasonic wave is 5 MHz, a wavelength thereof is about 400 µm. When the particle size of the filler is large, the filler is not likely to pass through spaces between the leads 20, which cause a problem that the backing member 1 cannot be manufactured. On the contrary, when the particle size of the filler is too small, the ultrasonic wave cannot be scattered sufficiently. Therefore, it is desirable that the particle size of the filler is set to be about ⅕ to ⅒ as large as the wavelength of the ultrasonic wave.

Accordingly, when the frequency of the ultrasonic wave is 5 MHz, the average particle size of the filler is preferably set at 40 µm to 80 µm.

Assume that each of the entire leads is formed into a structure having the same width and the same thickness differently from the embodiment. In this case, when both the pitch of the leads in the width direction and the pitch of the leads in the depth direction are 200 µm, and the width and the thickness of each of the leads are 150 µm, an interval between adjacent ones of the leads is 50 µm.

Therefore, the filler having an average particle size of 40 µm to 80 µm is hardly dispersed in the interval between adjacent ones of the leads. Accordingly, the backing member does not work.

However, in the embodiment, the width and the thickness of the wiring portion 24 of each of the leads 20 are set to be smaller than the width and the thickness of each of the terminal portions 22, as described above.

Assume that the pitch of the leads 20 in the width direction and the pitch of the leads 20 in the depth direction are 200 µm, and the width and the thickness of the wiring portion 24 of each of the leads 20 are 60 µm. In this case, the interval between adjacent ones of the wiring portions 24 of the leads 20 is therefore 140 µm. In this manner, the interval between the adjacent ones of the wiring portions 24 of the leads 20 is set to be wider than the average particle size of the fillers 52.

Thus, the fillers 52 can be injected uniformly into the gaps between the adjacent ones of the wiring portions 24 of the leads 20 in the width direction and the depth direction. Therefore, a high-performance backing member which can absorb the ultrasonic wave sufficiently can be obtained.

Moreover, the sectional area of each of the terminal portions 22 of the leads 20 can be formed largely to measure about 150 µm by 150 µm. Accordingly, the terminal portion 22 can be electrically connected to a corresponding piezoelectric element and a wiring board reliably.

As described above, when the resin 50a containing the filler 52 is injected into the product regions R of the stacked lead frames 5 in a step of FIG. 12, the filler 52 can be dispersed uniformly at the gaps between the adjacent ones of the wiring portions 24 of the leads 20 in the width direction and the depth direction.

Incidentally, when the frequency of the ultrasonic wave is relatively high, filler having a smaller average particle size than the particle size of the aforementioned filler can be used. Therefore, the interval between the adjacent ones of the wiring portions of the leads can be made narrower than that in the aforementioned example.

However, the particle size varies largely when the filler is produced.

Therefore, it is necessary to consider that a considerable amount of the fillers which are about twice as large as the average particle size may be contained.

Recently, the size of each of the piezoelectric elements has been made smaller and the density of arrangement of the piezoelectric elements has been made higher.

In accordance with this, the pitch of the leads also tends to be narrower.

However, as described above, the particle size of the fillers contained in the resin layer in order to scatter and attenuate the ultrasonic wave depends on the wavelength of the ultrasonic wave. Accordingly, the particle size of the fillers cannot be reduced even when the pitch of the wiring portions of the leads is narrower.

From this point of view, in each of the leads 20 according to the embodiment, the sectional area of the wiring portion 24 is smaller than the sectional area of each of the terminal portions 22. Accordingly, the interval between the adjacent ones of the leads 20 can be secured largely. Thus, the leads 20 can address the reduction in the pitch of the piezoelectric elements.

Further, even when the pitch of the leads 20 is made narrower, the width and the thickness of each of the wiring portions 24 are made smaller. Therefore, the leads 20 can be prevented from contacting each other easily. In addition, stray capacitance between adjacent ones of the leads 20 can be reduced so that crosstalk can be reduced.

Figure 13:
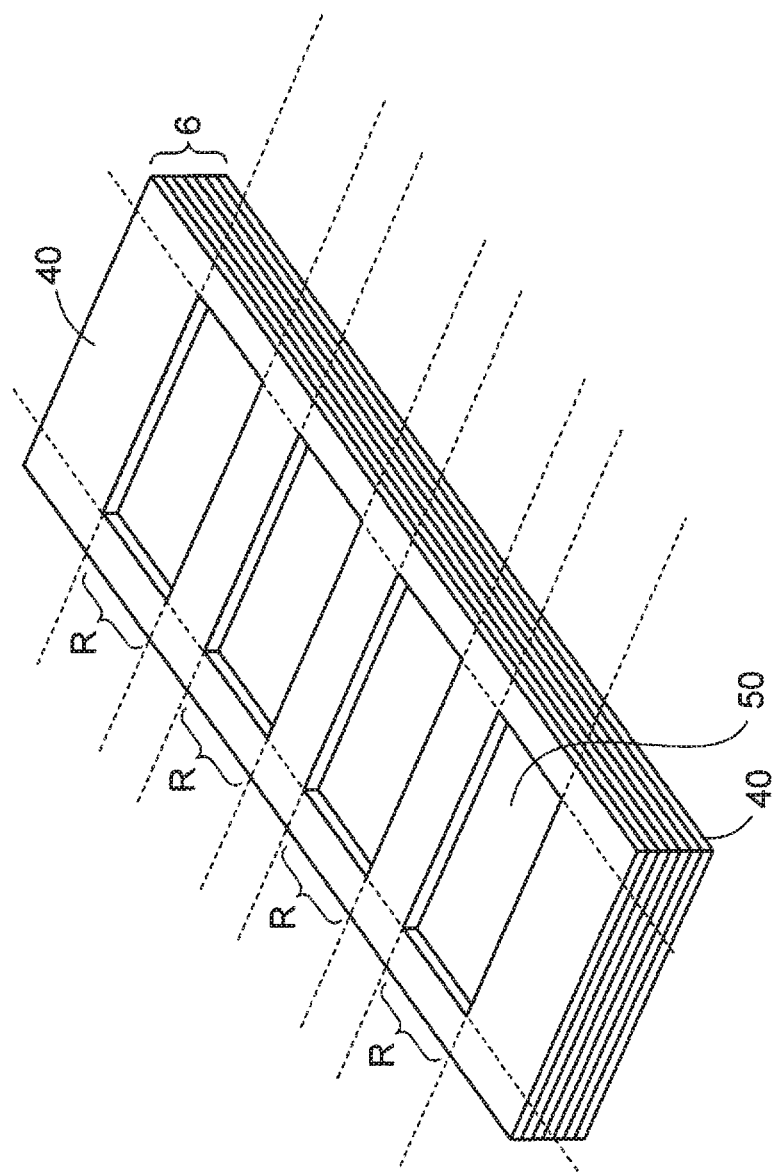
FIG. 13 is a perspective view (Part 11) showing the method for manufacturing the backing member according to the embodiment.

Next, as shown in FIG. 13, the lower-side support plate 30 and the upper-side support plate 32 are removed from the stacked body 6. On this occasion, due to the upper surface of the lower-side support plate 30 coated with the fluororesin, the lower-side support plate 30 can be released from the resin layer 50 easily.

Further, as indicated by broken lines in FIG. 13, the stacked body 6 is cut in the depth direction from the uppermost spacer 40 to the lowermost spacer 40 so that the product regions R in which the plurality of leads 20 have been stacked on one another can be obtained.

Figure 14:
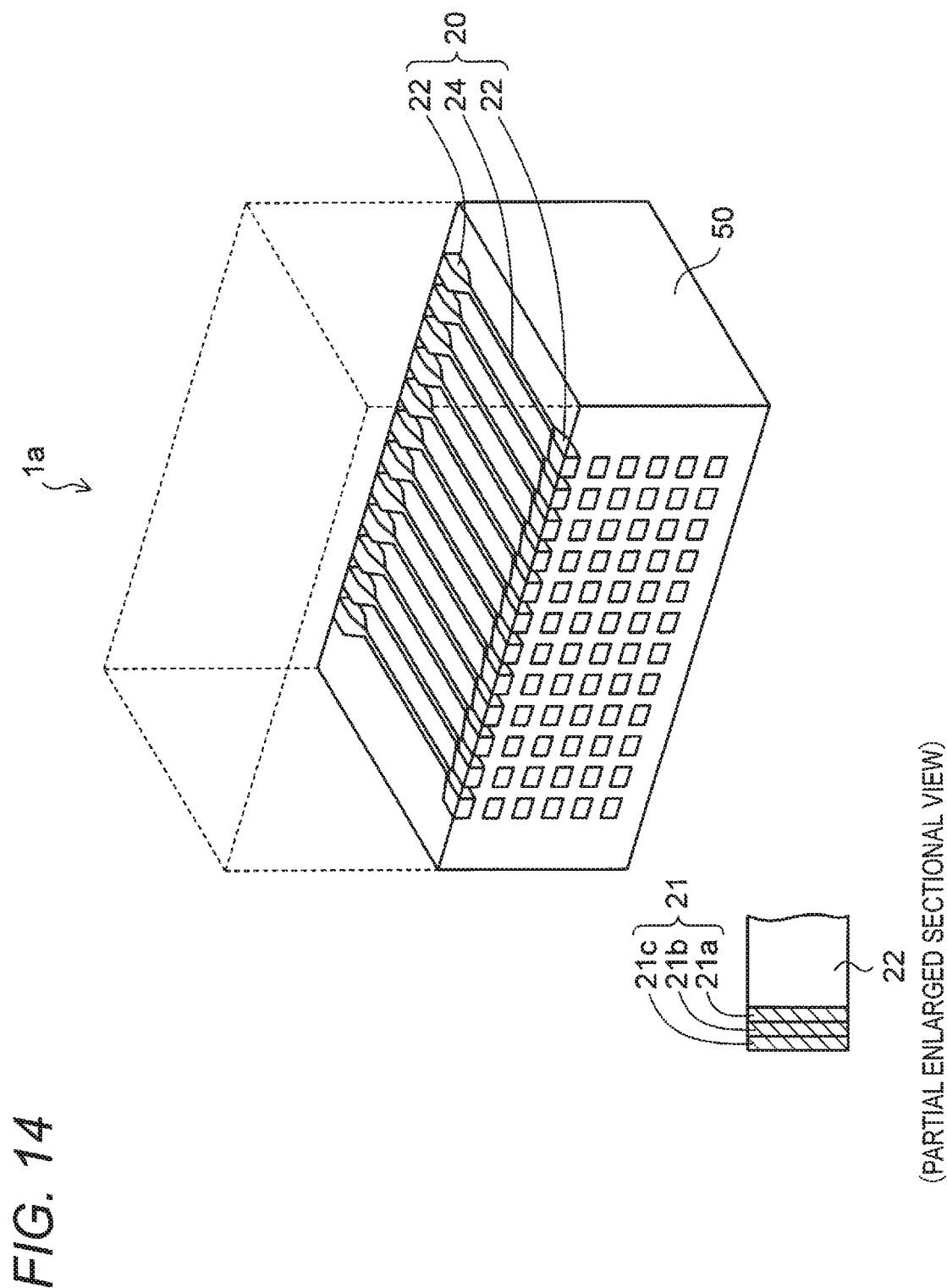
FIG. 14 is a perspective view (Part 12) showing the method for manufacturing the backing member according to the embodiment.
Figure 15:
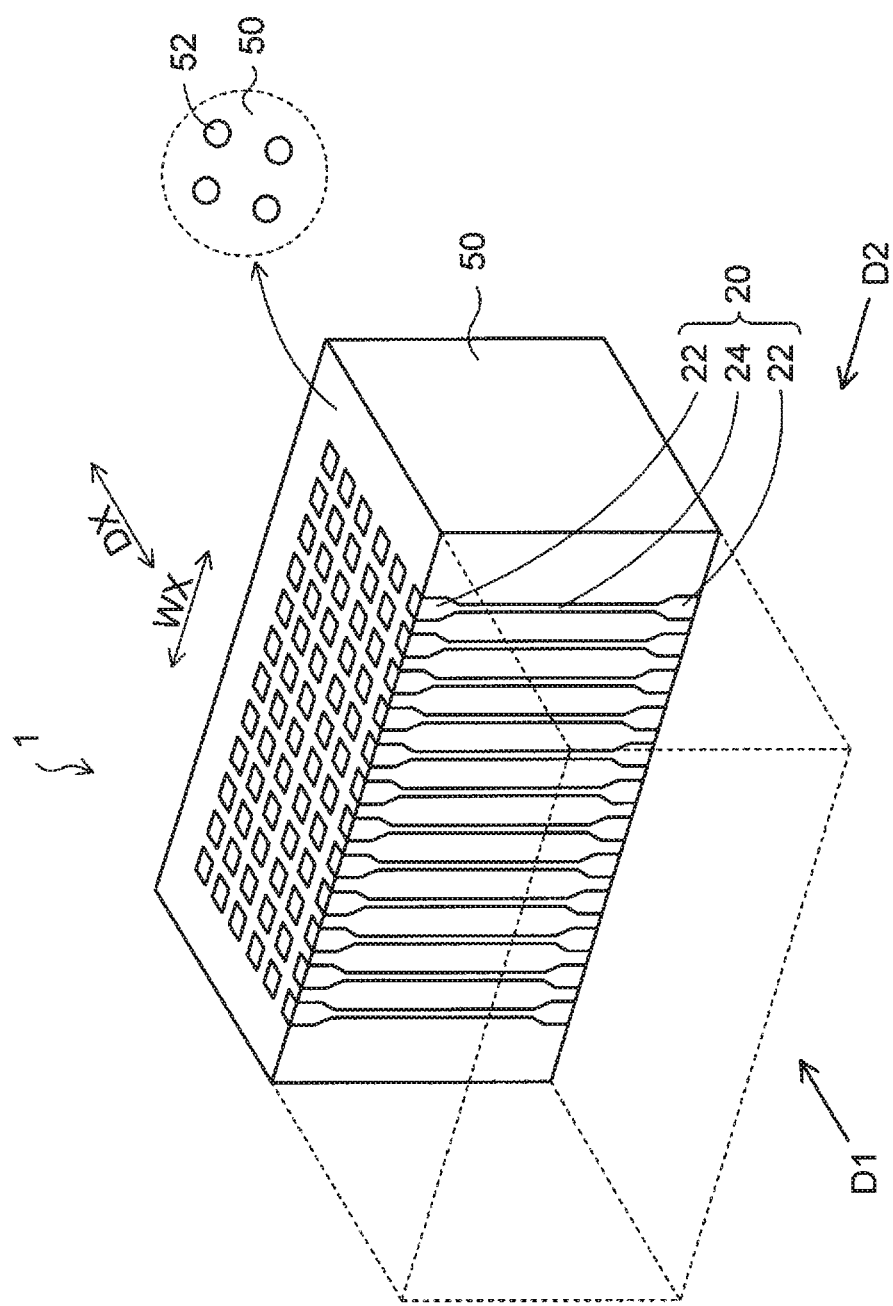
FIG. 15 is a perspective view showing the backing member according to the embodiment.

Thus, as shown in FIG. 14, a region corresponding to the outer frames 14 of the respective lead frames 5 is removed from the stacked body 6. The plurality of product regions R of the stacked body 6 are divided into stacked members 1a individually. In each of the stacked members 1a, each of the tip surfaces of the terminal portions 22 on the opposite sides of the leads 20 are exposed from opposite side surfaces of the resin layer 50.

As shown in FIG. 14, in the stacked member 1a immediately after the stacked body 6 in FIG. 13 has been cut, the leads 20 are arranged to extend in a direction facing the width direction.

Then, as shown in a partially enlarged sectional view of FIG. 14, contact layers 21 are formed by electroless plating on the tip surfaces of the terminal portions 22 on the opposite end sides of the leads 20 exposed from the resin layer 50. As each of the contact layers 21, a nickel (Ni) layer 21a/palladium (Pd) layer 21b/gold (Au) layer 21c is formed in the named sequence from the lower side.

For example, the thickness of the nickel layer 21a is 3 µm to 6 µm. The thickness of the palladium layer 21b is 0.1 µm. The thickness of the gold layer 21c is 0.05 µm.

Thus, as shown in FIG. 15, backing members 1 are obtained individually. In a perspective view of FIG. 15, the leads 20 of each of the backing members 1 are arranged to extend in a direction facing the depth direction.

As shown in FIG. 15, the backing member 1 according to the embodiment is provided with the resin layer 50, and the plurality of leads 20 embedded in the resin layer 50. In the example of FIG. 15, the resin layer 50 is formed into a rectangular parallelepiped. However, the resin layer 50 may be formed into various cubic shapes such as a circular column.

The fillers 52 are contained in the resin layer 50. For example, the resin layer 50 is formed of the epoxy resin etc. The fillers 52 are formed of tungsten, alumina, or the hollow glass balls etc.

Each of the leads 20 is arranged to penetrate through the resin layer 50 from an upper surface to a lower surface of the resin layer 50. The lead 20 is provided with the wiring portion 24 and the terminal portions 22. The wiring portion 24 is arranged at a central portion of the lead 20. The terminal portions 22 are connected to the opposite ends of the wiring portion 24.

FIG. 16A is a partially enlarged sectional view of the leads 20 in FIG. 15 as seen from a front direction D1. FIG. 16B is a partially enlarged sectional view of the leads 20 in FIG. 15 as seen from a horizontal direction D2.

As shown in FIG. 16A, the width dimension W1 of the wiring portion 24 in each of the leads 20 is set to be smaller than the width dimension W2 of each of the terminal portions 22. In addition, as shown in FIG. 16B, the depth dimension T1 of the wiring portion 24 in the lead 20 is set to be smaller than the depth dimension T2 of the terminal portion 22.

Thus, the sectional area of the wiring portion 24 in the lead 20 is set to be smaller than the sectional area of the terminal portion 22.

As described above in the aforementioned FIG. 5, the wiring portion 24 in the lead 20 is formed into a rectangular shape in section view. In addition, the terminal portion 22 is formed into a hexagon in section view, in which protrusions are arranged at central portions of opposite side surfaces.

As shown in FIG. 15, the entire side surfaces of the upper-side terminal portions 22 of the leads 20 are embedded in the resin layer 50. The tip surfaces of the upper-side terminal portions 22 of the leads 20 are exposed from the upper surface of the resin layer 50. The tip surfaces of the upper-side terminal portions 22 of the leads 20 are flush with the upper surface of the resin layer 50.

Similarly, the entire side surfaces of the lower-side terminal portions 22 of the leads 20 are embedded in the resin layer 50. The tip surfaces of the lower-side terminal portions 22 of the leads 20 are exposed from the lower surface of the resin layer 50. The tip surfaces of the lower-side terminal portions 22 of the leads 20 are flush with the lower surface of the resin layer 50.

In addition, as described above in the aforementioned FIG. 6, each of the wiring portions 24 of the leads 20 is connected to a depth-direction lower part of each of the terminal portions 22. Further refer to FIG. 16B in addition to the aforementioned FIG. 6. A depth-direction lower surface S1 of the side surfaces of the wiring portion 24 is substantially flush with a depth-direction lower surface S2 of the side surfaces of the terminal portion 22.

In such a connection structure, the width and the thickness of the wiring portion 24 are smaller than the width and the thickness of the terminal portion 22.

In the backing member 1 according to the embodiment, the fillers 52 are contained in the resin layer 50 so that the ultrasonic wave can be scattered and attenuated. Thus, the volume occupied by the resin layer 50 can be increased in accordance with the reduction in the sectional area of the wiring portion 24 of the lead 20. Therefore, the function of the backing member 1 can be improved.

In addition, as described in the aforementioned step of FIG. 12, the intervals between the adjacent ones of the leads 20 of the lead frames 5 in the width direction and the depth direction can be secured sufficiently when the resin 50a containing the fillers 52 is injected into the product regions R in which the leads 20 of the lead frames 5 have been stacked on one another. Thus, the fillers 52 can be dispersed stably in the intervals between the adjacent ones of the large number of leads 20.

Thus, the intervals between the adjacent ones of the wiring portions 24 of the leads 20 in the width direction WX and the depth direction DX are set to be wider than the average particle size of the fillers 52.

Thus, the fillers can be dispersed substantially in the entire backing member 1. Accordingly, the function of scattering and attenuating the ultrasonic wave sufficiently can be obtained.

In addition, each of the terminal portions 22 in the leads 20 has a sufficiently large sectional area. Accordingly, the terminal portion 22 can be electrically connected to the corresponding piezoelectric element and the wiring board reliably.

In addition, in the backing member 1 in FIG. 15, the lower surfaces S1 of the wiring portions 24 of the leads 20 stacked on one another in the depth direction DX face one and the same direction, as shown in the aforementioned FIG. 16B. Similarly, the lower surfaces S2 of the terminal portions 22 of the leads 20 stacked on one another in the depth direction DX face one and the same direction.

With such a stacking structure of the leads 20, the fillers 52 can be dispersed most uniformly in any region among the leads 20.

Alternatively, any other structure than the aforementioned stacking structure of the leads 20 may be used. For example, the plurality of leads 20 may be stacked on one another in the depth direction DX of the leads 20 in FIG. 15 so that the depth-direction lower surfaces S1 and S2 (FIG. 16B) of the wiring portions 24 and the terminal portions 22 can be opposed to each other respectively.

In this manner, in the aforementioned step of FIG. 8, the lead frames 5 may be stacked on one another so that the lower surfaces S1 of the wiring portions 24 adjacent to each other in the depth direction DX can be opposed to each other and the lower surfaces S2 of the terminal portions 22 adjacent to each other in the depth direction DX can be opposed to each other.

When the leads 20 according to the embodiment are used in this manner, the fillers 52 can be arranged in any space between adjacent ones of the leads 20 regardless of the stacking structure of the leads 20. Accordingly, it is possible to improve the scattering and absorption performance of the ultrasonic wave in comparison with that in the related-art technique.

Incidentally, in the example of FIG. 15, the upper surface and the lower surface of the backing member 1 are horizontal surfaces parallel with each other. Additionally, one surface (upper surface) on which piezoelectric elements are arranged may be formed as a convexly curved surface when a convex type ultrasonic probe is manufactured.

In this case, the tip surfaces of the terminal portions 22 of the leads 20 and the one surface of the resin layer 50 are ground to be formed into the same convexly curved surface.

In the example of FIG. 15, the leads 20 arrayed in the width direction WX are arranged in a straight shape and in parallel with one another. However, each of the leads 20 may be formed into a circular sector shape so that the pitch of the leads 20 can be converted in the width direction WX. When the aforementioned lead frame 5 in FIG. 7 is formed, each of the leads 20 may be formed into the circular sector or any of various lead patterns other than the circular sector can be formed easily.

Similarly, in the example of FIG. 15, the leads 20 arrayed in the depth direction DX are arranged in a straight shape and in parallel with one another.

However, the pitch may be converted in the depth direction DX.

In this case, when the aforementioned stacked body 6 in FIG. 9 is pressed, each of the side surface shapes of the lower-side support plate 30 and the upper-side support plate 32 is formed into a tapered shape in which thickness differs between one end side and the other end side. Thus, the pitch of the leads 20 can be changed between the one end side and the other end side in the depth direction DX.

In addition, in the example of FIG. 15, the width and the thickness of each of the wiring portions 24 of the leads 20 are set to be smaller than the width and the thickness of each of the terminal portions 22 on the opposite sides of the wiring portion 24. Additionally, the width and the thickness of the wiring portion 24 of the lead 20 may be set to be smaller than the width and the thickness of at least one of the terminal portions 22 on the opposite sides of the wiring portion 24 in accordance with various connection forms of the backing member.

For example, the width and the thickness of the wiring portion 24 of the lead 20 may be set to be smaller than the width and the thickness of the upper-side terminal portion 22 and the width and the thickness of the lower-side terminal portion 22 may be set to be equal to those of the wiring portion 24.

Next, an ultrasonic probe using the backing member 1 according to the embodiment will be described.

Figure 17:
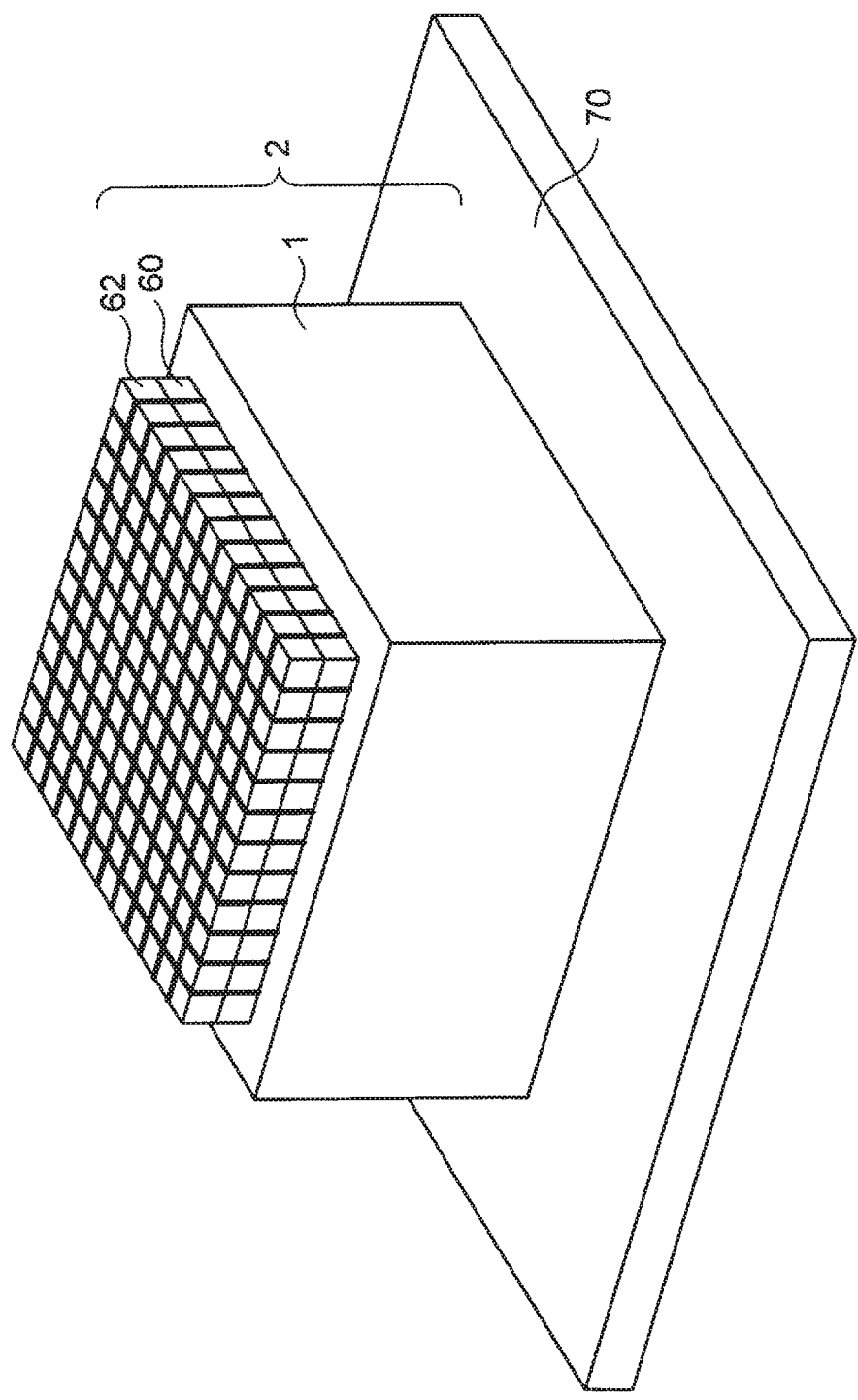
FIG. 17 is a perspective view of an ultrasonic probe according to the embodiment.

As shown in FIG. 17, an ultrasonic probe 2 (an example of an ultrasonic apparatus) according to the embodiment has the aforementioned backing member 1 in FIG. 15, a plurality of piezoelectric elements 60 (an example of ultrasonic wave transducer elements) arranged on the backing member 1, and an acoustic matching layer 62 arranged on the piezoelectric elements 60. In addition, an acoustic lens not shown may be mounted on the acoustic matching layer 62. Incidentally, electrostatic elements may be used as the ultrasonic wave transducer elements in place of the plurality of piezoelectric elements 60.

The piezoelectric elements 60 are divided into a large number and arranged two-dimensionally. The piezoelectric elements 60 are ultrasonic transducers. The ultrasonic wave can be transmitted/received by each of the piezoelectric elements 60.

The acoustic matching layer 62 arranged on the piezoelectric elements 60 is formed in order to make the ultrasonic wave incident from each of the piezoelectric elements 60 into a subject efficiently. The acoustic matching layer 62 is divided into a large number and arranged two-dimensionally in order to correspond to the divided piezoelectric elements 60 respectively.

In addition, the backing member 1 arranged on a lower side of the piezoelectric elements 60 is configured to absorb rearward propagation of the ultrasonic waves and suppress excessive vibration and shorten a pulse width of each of the ultrasonic waves to thereby improve a distance resolution of an image.

Further, a wiring board 70 is arranged on a lower side of the ultrasonic probe 2. A driver may be mounted on the wiring board 70 or the wiring board 70 may be merely a connection board connected to other circuit boards.

Figure 18:
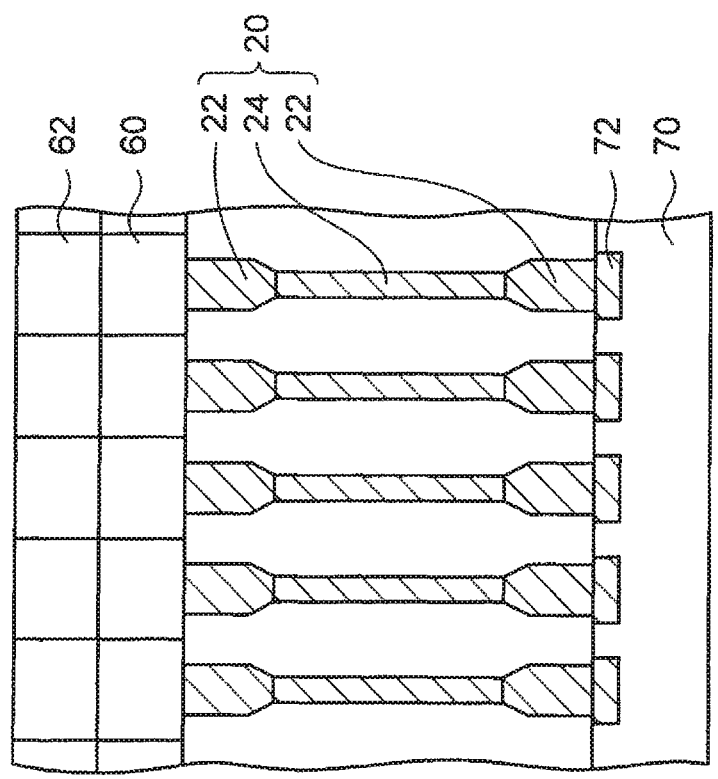
FIG. 18 is a partial sectional view showing a connection state of the ultrasonic probe in FIG. 17.

Refer to a sectional view of FIG. 18 in addition to FIG. 17. The tip surfaces of the upper-side terminal portions 22 of the leads 20 of the aforementioned backing member 1 are electrically connected to lower surfaces of the piezoelectric elements 60. In addition, the tip surfaces of the lower-side terminal portions 22 of the leads 20 are electrically connected to connection electrodes 72 of the wiring board 70.

A voltage is supplied from the wiring board 70 to the piezoelectric elements 60 through the leads 20 of the backing member 1 so that an ultrasonic wave can be transmitted from each of the piezoelectric elements 60 to a subject.

As described above, the backing member 1 according to the embodiment can sufficiently absorb the ultrasonic wave propagating rearward from each of the piezoelectric elements 60. Accordingly, it is possible to achieve an ultrasonic probe which is small in noise.

In addition, each of the terminal portions 22 of the leads 20 of the backing member 1 has a sufficient connection area. Accordingly, the terminal portions 22 of the leads 20 can be reliably electrically connected to the piezoelectric elements 60 and the connection electrodes 72 of the wiring board 70 respectively.

As described above, the exemplary embodiment and the modification are described in detail. However, the present invention is not limited to the above-described embodiment and the modification, and various modifications and replacements are applied to the above-described embodiment and the modifications without departing from the scope of claims.

Various aspects of the subject matter described herein are set out non-exhaustively in the following numbered clauses:

1) A method of manufacturing a backing member including a resin layer which contains a filler, and a plurality of leads each of which is embedded in the resin layer to penetrate through the resin layer from an upper surface of the resin layer to a lower surface of the resin layer, the method comprising:

a) preparing a metal plate;

b) patterning the metal plate to form a lead frame including the plurality of leads, wherein each of the leads comprises a wiring portion and a terminal portion connected to one end of the wiring portion, and a width dimension and a depth dimension of the wiring portion is smaller than a width dimension and a depth dimension of the terminal portion;

c) stacking a plurality of the lead frames on one another through a spacer to obtain a stacked body; and d) embedding the leads in the resin layer containing the filler, wherein an interval between adjacent ones of the wiring portions of the leads is wider than an average particle size of the filler.

2) The method of clause (1), further comprising:

e) cutting the stacked body to obtain the backing member.

3) The method of clause (1), wherein the spacer is formed of an elastic body, and the step c) comprises pressing the stacked body to compress the spacer to thereby adjust an interval between adjacent ones of the leads in a stacking direction.

4) The method of clause (1), wherein in the step b), the leads are connected to an outer frame, a first resist layer having a pattern corresponding to the outer frame and only the terminal portions of the leads is formed on one surface of the metal plate, a second resist layer having a pattern corresponding to the outer frame and the entire leads is formed on the other surface of the metal plate, the metal plate is wet-etched using the first resist layer and the second resist layer as a mask so as to form a lead frame including the plurality of leads, one depth-direction surface of side surfaces of each of the wiring portions is substantially flush with one depth-direction surface of side surfaces of each of the terminal portions, and in the step b), the first resist layer and the second resist layer are removed.

5) The method of clause (3), wherein the spacer is formed of an elastic resin.

6) The method of clause (3), wherein in the step c), the stacked body is arranged between a lower-side support plate and an upper-side support plate, a height adjusting stopper is arranged between the lower-side support plate and the upper-side support plate, and the upper-side support plate is brought into contact with the height adjusting stopper so as to adjust a thickness of the stacked body.

What is claimed is:

1. A backing member comprising:

a resin layer which contains a filler; and a plurality of leads each of which is embedded in the resin layer to penetrate through the resin layer from an upper surface of the resin layer to a lower surface of the resin layer, wherein each of the leads comprises a wiring portion, and a terminal portion connected to one end of the wiring portion, a width dimension and a depth dimension of the wiring portion are smaller than a width dimension and a depth dimension of the terminal portion, an interval between adjacent ones of the wiring portions of the leads is wider than an average particle size of the filler, and one depth-direction surface of the side surfaces of the wiring portion is substantially flush with one depth-direction surface of the side surfaces of the terminal portion.

2. The backing member of claim 1, wherein side surfaces of the terminal portion are embedded in the resin layer, and a tip surface of the terminal portion is exposed from an upper surface or a lower surface of the resin layer.

3. The backing member of claim 1, wherein a sectional shape of the wiring portion is rectangular.

4. An ultrasonic apparatus comprising:

a backing member; and a plurality of ultrasonic wave transducer elements arranged on the backing member, wherein the backing member comprises:

a resin layer which contains a filler; and a plurality of leads each of which is embedded in the resin layer to penetrate through the resin layer from an upper surface of the resin layer to a lower surface of the resin layer, each of the leads comprises a wiring portion, and a terminal portion connected to one end of the wiring portion, a width dimension and a depth dimension of the wiring portion are smaller than a width dimension and a depth dimension of the terminal portion, an interval between adjacent ones of the wiring portions of the leads is wider than an average particle size of the filler, each of the ultrasonic wave transducer elements is electrically connected to a corresponding one of the terminal portions of the leads, and one depth-direction surface of the side surfaces of the wiring portion is substantially flush with one depth-direction surface of the side surfaces of the terminal portion.

* * * * *